(12) United States Patent
Goldstein (10) Patent No.: US 6,684,275 B1
(45) Date of Patent: Jan. 27, 2004

(54) SERIAL-TO-PARALLEL/PARALLEL-TO-SERIAL CONVERSION ENGINE

(75) Inventor: Jason A. Goldstein, Brookline, MA (US)

(73) Assignee: Octave Communications, Inc., Salem, NH (US)

( * ) Notice: Subject to any disclaimer, the term of this patent is extended or adjusted under 35 U.S.C. 154(b) by 0 days.

(21) Appl. No.: 09/427,669

(22) Filed: Oct. 23, 1999

Related U.S. Application Data (60) Provisional application No. 60/105,369, filed on Oct. 23, 1998.

(51) Int. Cl.[7] .............................................. G06F 13/12
(52) U.S. Cl. .............................. 710/71; 710/2; 341/100
(58) Field of Search ............................... 710/71, 2, 38; 341/100, 101

(56) References Cited

U.S. PATENT DOCUMENTS

| | | | |
|---|---|---|---|
| 4,924,464 A | | 5/1990 | Baylock |
| 5,463,630 A | | 10/1995 | Tooher |
| 5,680,127 A | * | 10/1997 | Nagamatsu et al. ........ 341/101 |
| 5,812,881 A | * | 9/1998 | Ku et al. ........................ 710/2 |
| 5,926,120 A | * | 7/1999 | Swenson et al. ............ 341/100 |
| 6,122,683 A | * | 9/2000 | Ku et al. ..................... 341/100 |
| 6,128,681 A | * | 10/2000 | Shephard ...................... 710/38 |

OTHER PUBLICATIONS

H.110 Hardware Compatibility Specification: CT Bus, 1997.
Mitel Application Note MSAN–148, Sep. 1994.

\* cited by examiner

*Primary Examiner*—Jeffrey Gaffin
*Assistant Examiner*—Harold Kim
(74) *Attorney, Agent, or Firm*—Dorr, Carson, Sloan & Birney, P.C.

(57) ABSTRACT

A serial-to-parallel/parallel-to-serial conversion engine provides a bi-directional interface between a serial TDM highway and a parallel TDM highway. The conversion engine includes a serial-to-parallel data conversion device receives a serially received data word and provides a parallel output data word. The conversion engine includes a serial data input interface that receives the serially received data word and provides a received data word. A serial-to-parallel mapping circuit receives the received data word and generates memory write control and write address signals. A memory device includes a first port responsive to the memory write control signals and write address signals for writing the received data word into the memory device, and a second port responsive to memory read control and read address signals for reading data from the memory device. Output interface circuitry generates the memory read control and read address signals, and receives output data from the memory device and reorders the bits of the parallel output data to provide the parallel data word. The conversion engine also includes a parallel-to-serial conversion device that receives a parallel received data word and provides a serial data word. The parallel-to-serial conversion device includes a memory device having a first port responsive to memory write control and write address signals, and a second port responsive to memory read control and read address signals. A parallel-to-serial mapping circuit receives the parallel received data word and generates the memory write control and write address signals to write a bit shuffled version of the parallel received data word into the memory device. A data output interface generates the memory read control and read address signals to perform reads from the memory device and receives output data from the memory device to provide the serial data word.

7 Claims, 11 Drawing Sheets

READ ADDRESS

| 15 | 14 | 13 | 12 | 11 | 10 | 9 | 8 | 7 | 6 | 5 | 4 | 3 | 2 | 1 | 0 |

— 104
— 102
— 100

WRITE ADDRESS

| 120 | 121 | 122 | 123 | 124 | 125 | 126 | 127 |
| 112 | 113 | 114 | 115 | 116 | 117 | 118 | 119 |
| 104 | 105 | 106 | 107 | 108 | 109 | 110 | 111 |
| 96 | 97 | 98 | 99 | 100 | 101 | 102 | 103 |
| 88 | 89 | 90 | 91 | 92 | 93 | 94 | 95 |
| 80 | 81 | 82 | 83 | 84 | 85 | 86 | 87 |
| 72 | 73 | 74 | 75 | 76 | 77 | 78 | 79 |
| 64 | 65 | 66 | 67 | 68 | 69 | 70 | 71 |
| 56 | 57 | 58 | 59 | 60 | 61 | 62 | 63 |
| 48 | 49 | 50 | 51 | 52 | 53 | 54 | 55 |
| 40 | 41 | 42 | 43 | 44 | 45 | 46 | 47 |
| 32 | 33 | 34 | 35 | 36 | 37 | 38 | 39 |
| 24 | 25 | 26 | 27 | 28 | 29 | 30 | 31 |
| 16 | 17 | 18 | 19 | 20 | 21 | 22 | 23 |
| 8 | 9 | 10 | 11 | 12 | 13 | 14 | 15 |
| 0 | 1 | 2 | 3 | 4 | 5 | 6 | 7 |

SERIAL-TO-PARALLEL/PARALLEL-TO-SERIAL CONVERSION ENGINE

CROSS REFERENCE TO RELATED APPLICATIONS

This application claims priority from the provisional application designated serial number 60/105,369, filed Oct. 23, 1998 and entitled "Serial-to-Parallel/Parallel-to-Serial Conversion Engine". This application is hereby incorporated by reference.

BACKGROUND OF THE INVENTION

The present invention relates to apparatus and method for converting serial bit streams into parallel bit streams and visa versa.

In many electronic systems, digital data must be transferred over a digital bus at a fixed rate (i.e., isochronous) between devices. These digital buses include a clock, synchronization signal and the data. The clock rate is fixed and both the synchronization signal and data are measured relative to it. On a serial TDM bus, the data is transferred one bit at a time (either MSB or LSB first) and the synchronization signal is used to mark the start of the data word. On a parallel TDM bus, all of the bits of the data are transferred at the same time. In the latter case, the synchronization signal is superfluous.

Time Division Multiplexing (TDM) is a known technique for combining N isochronous streams of digital data operating at the same frequency into one isochronous stream of data that operates at a new frequency M equal to N times the original frequency. The synchronization pulses still occur at the original frequency. The combined data transferred between synchronization pulses is called a frame. Each frame is broken into N equally sized pieces called time-slots. Each of the original streams are allotted one of the N time-slots per frame to transfer data. Each stream uses the same time-slot during each frame. As an example, the ST-Bus™ defined by Mitel Semiconductor™ uses a clock rate of 2.048 Mbits/second, 4.096 Mbits/second, or 8.192 Mbits/second with a frame rate of 8 kHz to combine 32, 64, or 128 64-Kbits/second serial streams into one stream.

In general, serial TDM buses have been used in favor of parallel TDM buses because serial TDM buses require fewer connections between devices. However, it is common to see multiple serial TDM streams running in parallel to achieve increased bandwidth (e.g., MVIP, SCSA, and H.110 computer telephony buses). These multiple streams are often referred to as a TDM highway.

In systems using multiple serial streams it becomes necessary to create a digital switch that is capable of transmitting data from a time-slot on one stream onto either a different timeslot on the same stream or onto another stream altogether. As the number of serial TDM streams increases, these switching devices usually convert the serial TDM streams into a parallel TDM stream internally to the device. This makes it easier to store the data in memory.

If the data on the streams is to be processed by a computer, again the data must be converted from serial to parallel form. Often a single stream serial-to-parallel converter is incorporated into the computer. The serial port is connected to a switching device and other streams are then connected to the TDM highway.

These two concepts can be combined so that data taken from the TDM highway is converted to parallel and stored in a memory device (e.g., a RAM). for use by the processor. The processor also places data to be transmitted on the TDM highway into the memory device, and the circuit converts this data from parallel to serial.

Figure 1:
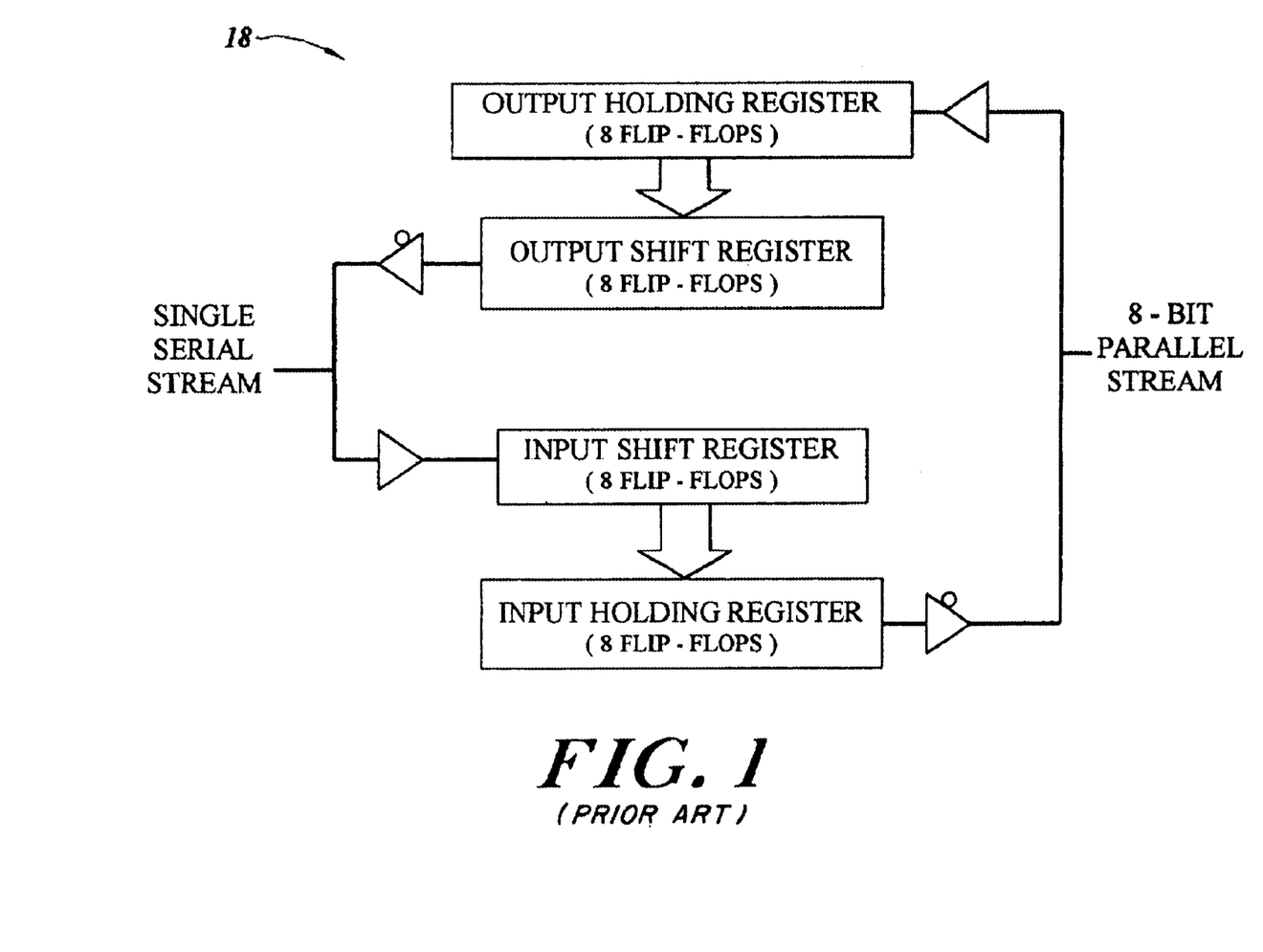
FIG. 1 is a block diagram illustration of a prior art serial-to-parallel/parallel-to-serial conversion engine.

FIG. 1 illustrates a block diagram of a prior art parallel-to-serial/serial-to-parallel conversion engine 18 for connecting to a serial stream. Each timeslot may be either driven from this circuit or received from a different circuit. The (tri-state) buffers illustrate that the same wires are used for input and output. The mechanism by which data is moved from the parallel stream into (and out of) the holding register as well as the control circuit for the tri-state buffers is not covered in this document.

The shift registers are clocked at the bit rate of the serial stream (e.g., 8.192 MHz), however there is usually a phase shift of either 180° or 270° between the outgoing and incoming clocks. At the timeslot boundary the outgoing data is moved from the output holding register to the output shift register. At the same time, the incoming data is moved from the input shift register to the input holding register. The data in the shift registers is corrupted after only one bit-slot without the use of the holding registers. This is generally not enough time to move the data from multiple serial streams onto the parallel bus.

Referring still to FIG. 1, thirty-two flip-flops are used per serial stream. Therefore, 1024 flip-flops are necessary in this embodiment to support the thirty-two streams of the H.100/H.110 bus. Significantly, all thirty-two output holding registers are unloaded and all thirty-two input holding registers are loaded at the same time causing an undesirably large amount of power to dissipate at one instant. In addition, a large decoder and multiplexor is required to move data to and from the holding registers.

An improved technique is disclosed in U.S. Pat. 4,924,464 entitled "Technique for Converting Either Way Between a Plurality of N Synchronized Serial Bit Streams and a Parallel IDM Format". This patent discloses the use of a two dimensional barrel shifter to implement the parallel-to-serial and serial-to-parallel conversions. Notably, this technique uses half of the number of flip-flops in comparison to the prior art system illustrated in FIG. 1. However, the system disclosed in this U.S. patent requires a large number of interconnects between flip-flops, and again all of the flip-flops are loaded on each clock edge causing a relatively large amount of power to dissipate at the same time.

Therefore, there is a need for an improved serial-to-parallel and parallel-to-serial converter.

SUMMARY OF THE INVENTION

Briefly, according to a first aspect of the present invention, a serial-to-parallel data conversion device receives a serially received data word and provides a parallel output data word. The conversion engine includes a serial data input interface that receives the serially received data word and provides a received data word. A serial-to-parallel mapping circuit receives the received data word and generates memory write control and write address signals. A memory device includes a first port responsive to the memory write control signals and write address signals for writing the received data word into the memory device, and a second port responsive to memory read control and read address signals for reading data from the memory device. Output interface circuitry generates the memory read control and read address signals, and receives output data from the memory device and reorders the bits of the parallel output data to provide the parallel data word.

According to another aspect of the present invention, a parallel-to-serial conversion device receives a parallel received data word and provides a serial data word. The parallel-to-serial conversion device includes a memory device having a first port responsive to memory write control and write address signals, and a second port responsive to memory read control and read address signals. A parallel-to-serial mapping circuit receives the parallel received data word and generates the memory write control and write address signals to write a bit shuffled version of the parallel received data word into the memory device. A data output interface generates the memory read control and read address signals to perform reads from the memory device and receives output data from the memory device to provide the serial data word.

The conversion engines of the present invention provide a bi-directional interface between a serial TDM highway and a parallel TDM highway.

Advantageously, the present invention uses significantly fewer transistors and consumes significantly less power than earlier implementation. The amount of the savings increases as the number of streams in the serial TDM highway increases.

These and other objects, features and advantages of the present invention will become apparent in light of the following detailed description of preferred embodiments thereof, as illustrated in the accompanying drawings.

DETAILED DESCRIPTION OF THE INVENTION

The present invention shall be discussed in the context of use in a computer telephony (CT) system. Specifically, a CT system that operates with the H.110 standard telephony bus.

However, one of ordinary skill will appreciate that the present invention is not limited to use in a CT system or a system that employs the H.110 bus. Indeed, the conversion engine of the present invention may be used in virtually any system that requires serial-to-parallel and/or parallel-to-serial data conversion.

Figure 2:
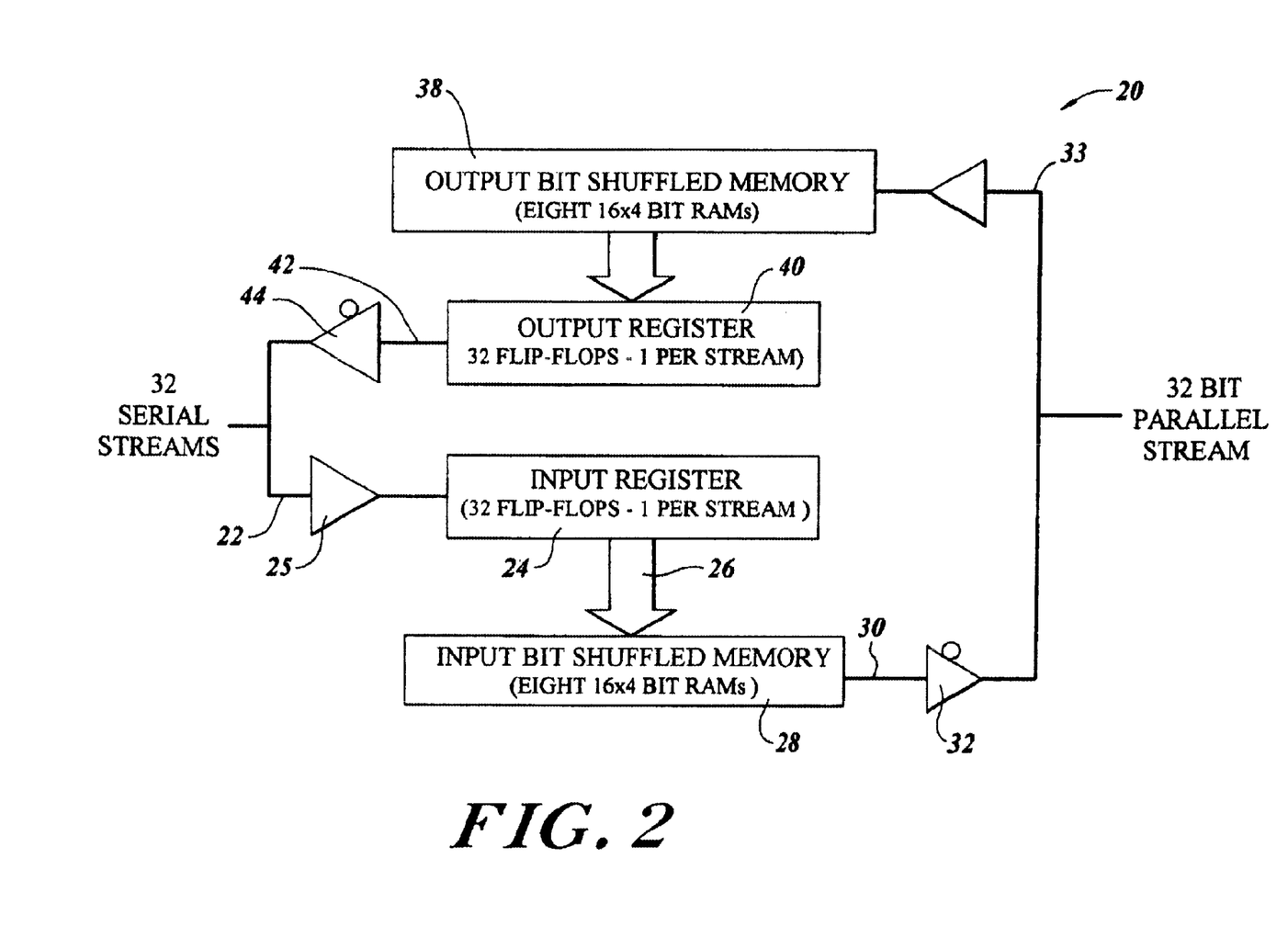
FIG. 2 is a block diagram illustration of a serial-to-parallel/parallel-to-serial conversion engine according to the present invention.

FIG. 2 is a block diagram illustration of a serial-to-parallel/parallel-to-serial conversion engine 20 according to the present invention. In one embodiment the conversion engine may be located within a field programmable gate array (FPGA). The conversion engine 20 receives a plurality of serial data lines 22 (e.g., thirty-two) that are input to a serial input interface 24 via buffers 25. Each data line provides 128 time-slots operating at a bit rate of 8.192 MHz. Therefore, the thirty-two data lines (also known as "streams") provide a total of 4,096 time-slots. The serial input interface is preferably simply a plurality of clocked registers for capturing data from the serial data lines 22. The serial input interface 24 provides clocked data on lines 26 to an input bit shuffled memory device 28 that stores the data, and provides parallel output data on lines 30 to tri-state buffers 32 that output the data onto the thirty-two bit parallel bus 33. The details of how the input bit shuffled memory device 28 stores the data shall be discussed in detail hereinafter.

The conversion engine 20 also receives parallel data from the thirty-two bit parallel bus 33, and stores the data in a output bit shuffled memory device 38. Data read from the memory device 38 is output to a serial data output interface 40 that provides a plurality of serial data output lines 42 (e.g., thirty-two) to a tri-state buffer 44 and onto the serial data lines 22. The details of how the output bit shuffled memory device 38 stores the data shall also be discussed in detail hereinafter.

Figure 3:
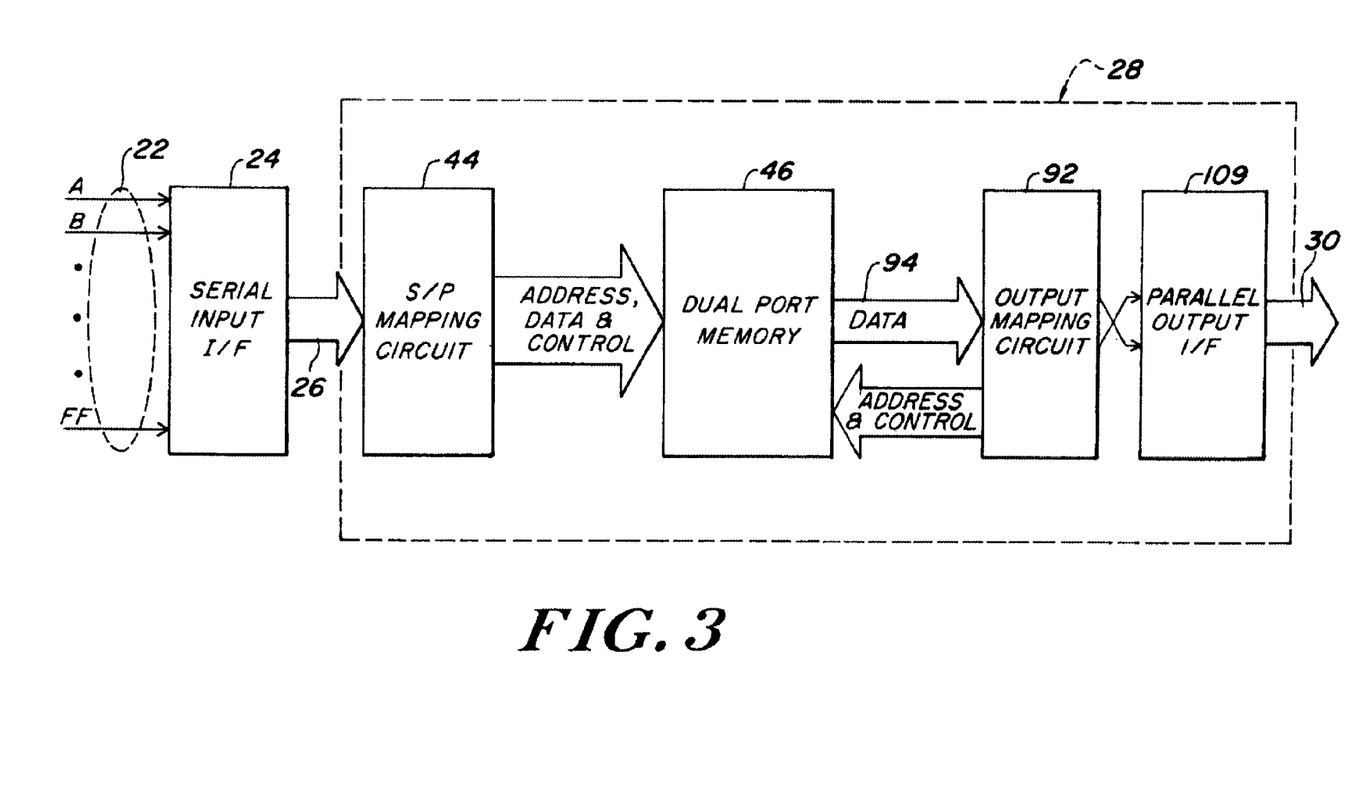
FIG. 3 is a functional illustration of the serial-to-parallel conversion path of the conversion engine illustrated in FIG. 2.

FIG. 3 is a functional illustration of the serial-to-parallel conversion path of the conversion engine 20 illustrated in FIG. 2. The serial input interface 24 includes a plurality of clocked registers that provide clocked data on the lines 26 to a serial-to-parallel mapping circuit 44. The mapping circuit 44 partitions data received on the lines 26 into a plurality segments. For example, in a preferred embodiment the clocked data is thirty-two bits wide and the serial-to-parallel mapping circuit 44 partitions the data into eight individual nibbles (i.e., four bits). The serial-to-parallel mapping circuit 44 then generates the necessary command (e.g., writes enables) and address signals to consecutively write the nibbles to a dual port memory device 46 (e.g., a RAM). Each of the nibbles is written to its own memory location within the dual port memory device 46.

Figure 4A:
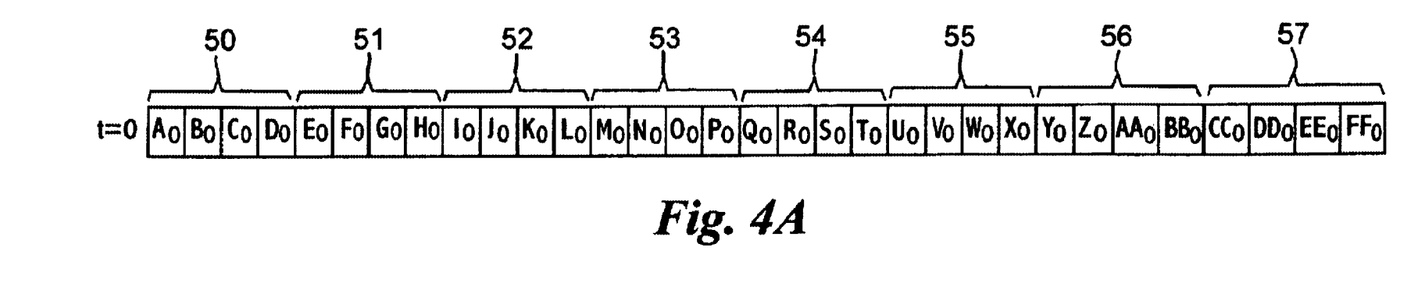
FIG. 4A is a pictorial illustration of the layout of the data resident in the serial-to-parallel mapping circuit at time t=0.
Figure 4B:
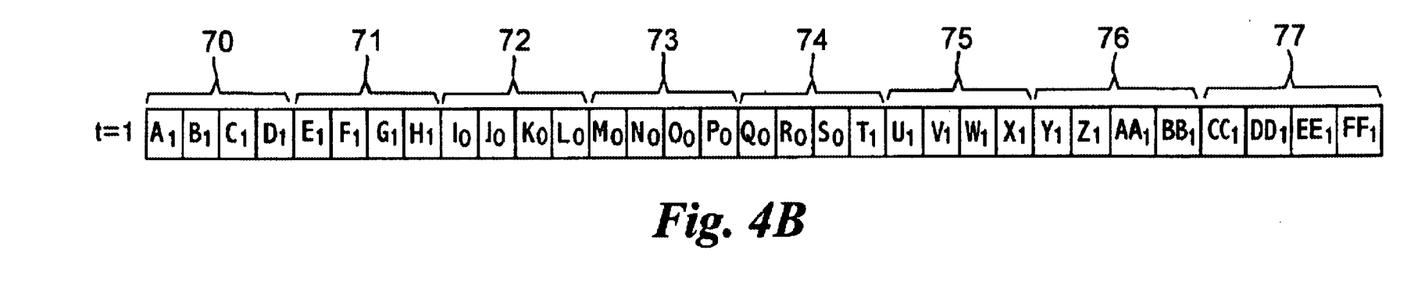
FIG. 4B is a pictorial illustration of the layout of the data resident in the serial-to-parallel mapping circuit at time t=1.

FIG. 4A is a pictorial illustration of the layout of the data on the lines 26 at time t=0. Time t=0 is representative of the time that the first data bits (i.e., bit one for each of the thirty-two eight bit words) are received by the serial input interface 24. The numerical subscripts in FIG. 4A are representative of time. Therefore, as shown, the thirty-two bits on the lines 26 at time t=0 are represented as $A_0, B_0, \ldots, EE_0, FF_0$. FIG. 4B is a pictorial illustration of the layout of the individual bits on the lines 26 at the time t=1. In the H.110 compatible embodiment the time difference between t=0 and t=1 is 8 (1/8,192,000) seconds.

Figure 5:
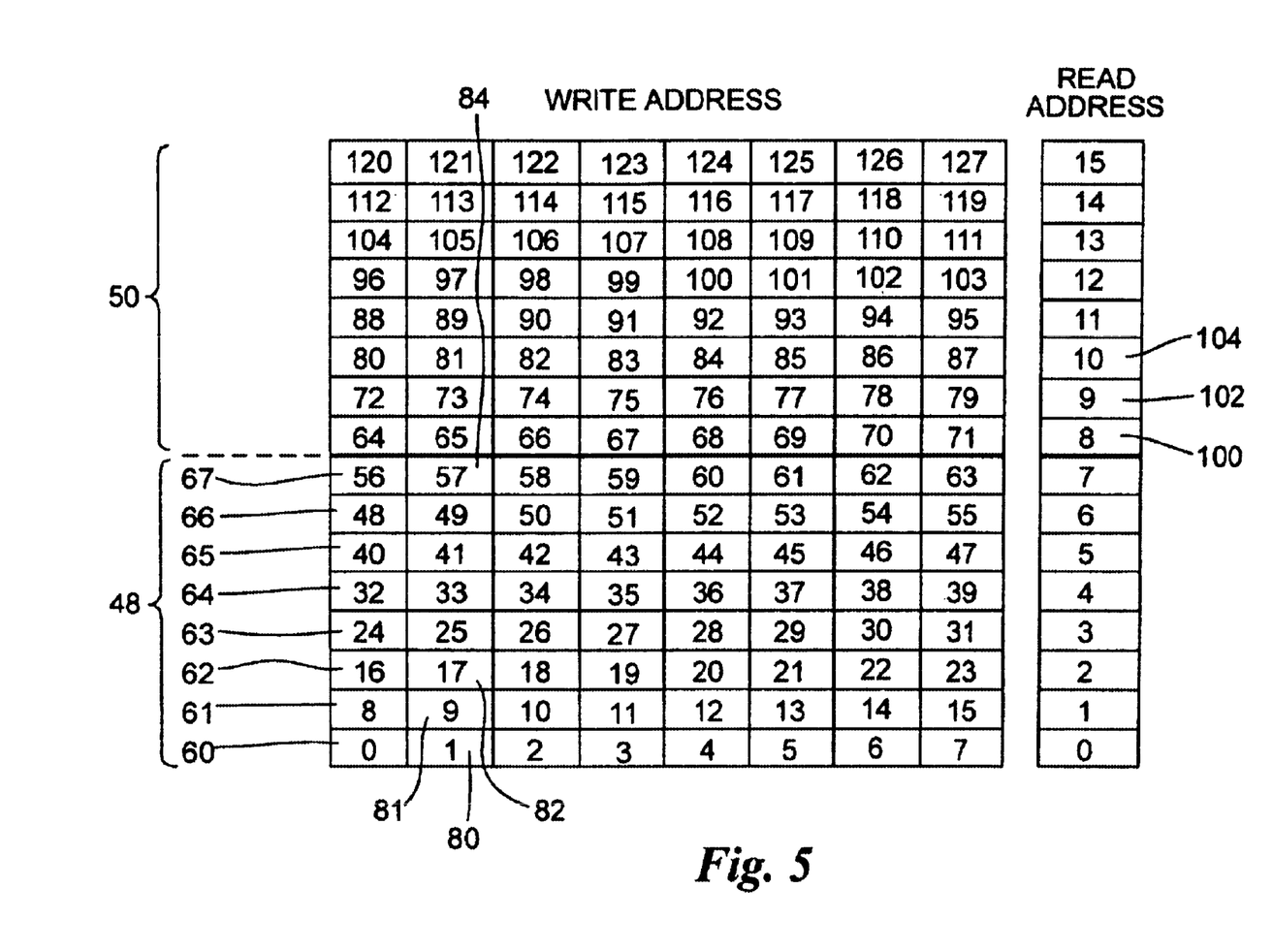
FIG. 5 is a pictorial illustration of labeled memory locations within the serial-to-parallel dual port memory illustrated in FIG. 3.

FIG. 5 is a pictorial illustration of labeled memory locations within the serial-to-parallel dual port memory 46 illustrated in FIG. 3. The memory device 46 includes two banks 48, 50 of memory, which allows information to be written to a first bank 48 at the same time that information is being read from a second bank 50. In this embodiment each bank 48,50 includes sixty-four separately write addressable four-bit memory locations.

Referring now to FIGS. 3, 4A and 5, as set forth above, the serial-to-parallel mapping circuit. 44 (FIG. 3) partitions the thirty-two bit data word (FIG. 4A), for example into eight nibbles 50–57 (FIG. 4A). The eight nibbles 50–57 (FIG. 4A) are then consecutively written to the memory device 46. For example, during time t=0 the eight nibbles 50–57 (FIG. 4A) are written into the first column of the first memory bank 48, which includes eight individually write addressable four-bit memory locations 60–67. Specifically, nibble #1 50 (FIG. 4A) is written: to memory location 0 60 (FIG. 5); nibble #2 51 (FIG. 4A) is written to memory location 8 61 (FIG. 5); nibble #3 52 (FIG. 4A) is written to memory location 16 62 (FIG. 5), and lastly nibble #8 (FIG. 4A) is written to memory location 56 67 (FIG. 5). Significantly, the writes to the dual port memory device 46 for the data word received at t=0 must be completed before new data is clocked into the serial-to-parallel mapping circuit 44 (FIG. 3) at time t=1. Therefore, the writes to the dual port memory device occur at least eight times as fast as the rate bits are received the input register 24 (FIG. 2) to ensure the eight nibbles 50–57 (FIG. 4A) are written prior to receipt of the next data bits at time t=1.

Figure 6:
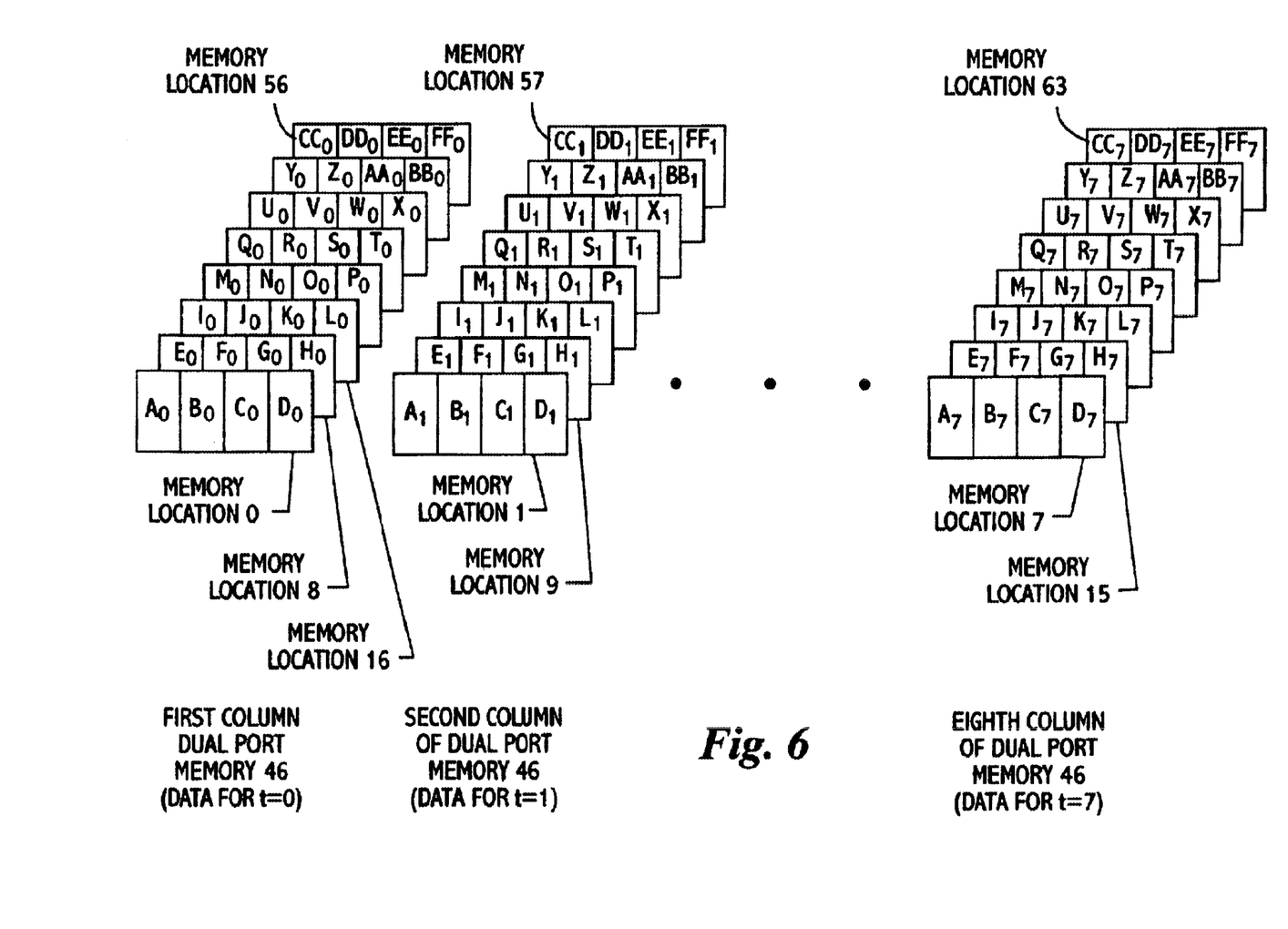
FIG. 6 is another pictorial illustration of the layout of data within the dual port memory device illustrated in FIG. 3.

FIG. 6 is another pictorial illustration of the layout of data within the dual port memory device 46 (FIG. 3). As shown, nibble #1 containing bits $A_0$ $B_0C_0D_0$ has been written to memory location 0, nibble #2 containing $E_0F_0G_0$ $H_0$ has been written to memory location 8, etc.

Referring now to FIGS. 3, 4B and 5, at time t=1 the serial-to-parallel mapping circuit 44 (FIG. 3) clocks in the next thirty-two bits of data on the lines 26, and the thirty-two bits are partitioned into eight nibbles 70–77 (FIG. 4B). The eight nibbles 70–77 (FIG. 4B) are then consecutively written to the second column of the memory device 46 (FIG. 5), which includes eight individually write addressable four-bit memory locations. Specifically, nibble #1 70 (FIG. 4B) is written to memory location 1 80 (FIG. 5); nibble #2 71 (FIG. 4B) is written to memory location 9 81 (FIG. 5); nibble #3 72 (FIG. 4B) is written to memory location 17 82 (FIG. 5), and lastly nibble #8 77 (FIG. 4B) is written to memory location 57 84 (FIG. 5). The writes to the memory device 46 (FIG. 3) for the data word received at time t=1 must be completed before new data is clocked into the serial-to-parallel mapping circuit 44 (FIG. 3) at time t=2.

Referring again to FIG. 6, nibble #1 containing bits $A_1B_1C_1D_1$ has been written to memory location 1 and nibble #2 containing $E_1F_1G_1H_1$ has been written to memory location 9. The nibbles #3–#7 are written to their associated memory location, and nibble #8 containing $CC_1DD_1EE_1FF_1$ is written to memory location 57.

This pattern repeats as the serial-to-parallel mapping circuit 44 (FIG. 3) receives data at time periods t=2,3,4,5 and 6. The data received at each of these periods is written into the third through seventh columns, respectively of the dual port memory device 46. During time t=7, the thirty-two bit data word $A_7B_7C_7$ . . . $FF_7$ is received by the serial-to-parallel mapping circuit 44 (FIG. 3), partitioned into nibbles and each of the nibbles is written into the associated memory locations (i.e., write memory locations 7, 15, 23, 31, 39, 47, 55 and 63—see FIG. 5) in the eighth column of the memory device 46. The next series of writes occur in the second bank 50 and reads in the first bank 48.

In one embodiment, the dual port memory device 46 may include eight 16×4 bit dual ports RAMs that collectively define the memory device 46, wherein each of the RAMs provides one the eight columns illustrated in FIGS. 5 and 6. Alternatively, the dual port memory device may include a single 16×32 bit dual port RAM.

Referring to FIGS. 3 and 5, while the first bank 48 (FIG. 5) of the dual port memory device 46 is being written to by the serial-to-parallel mapping circuit 44 (FIG. 3), the second bank 50 (FIG. 5) is being read by a parallel output mapping circuit 92 (FIG. 3). This output mapping circuit 92 generates the necessary address signals and control signals to perform the read, and receives thirty-two bits of data on lines 94 (FIG. 3) from the memory device 46 (FIG. 3). For example, during time t=0 the parallel mapping output circuit 92 (FIG. 3) reads from. read address 8 100 (FIG. 5) of the memory device 46 which includes the data stored at write addresses 64–71. During time t=1 the parallel mapping output circuit 92 reads from read address 9 102 that includes writes address 72–79; during t=2 the circuit 92 reads from read address 10 104 that includes write addresses 80–87, etc.

Figure 7:
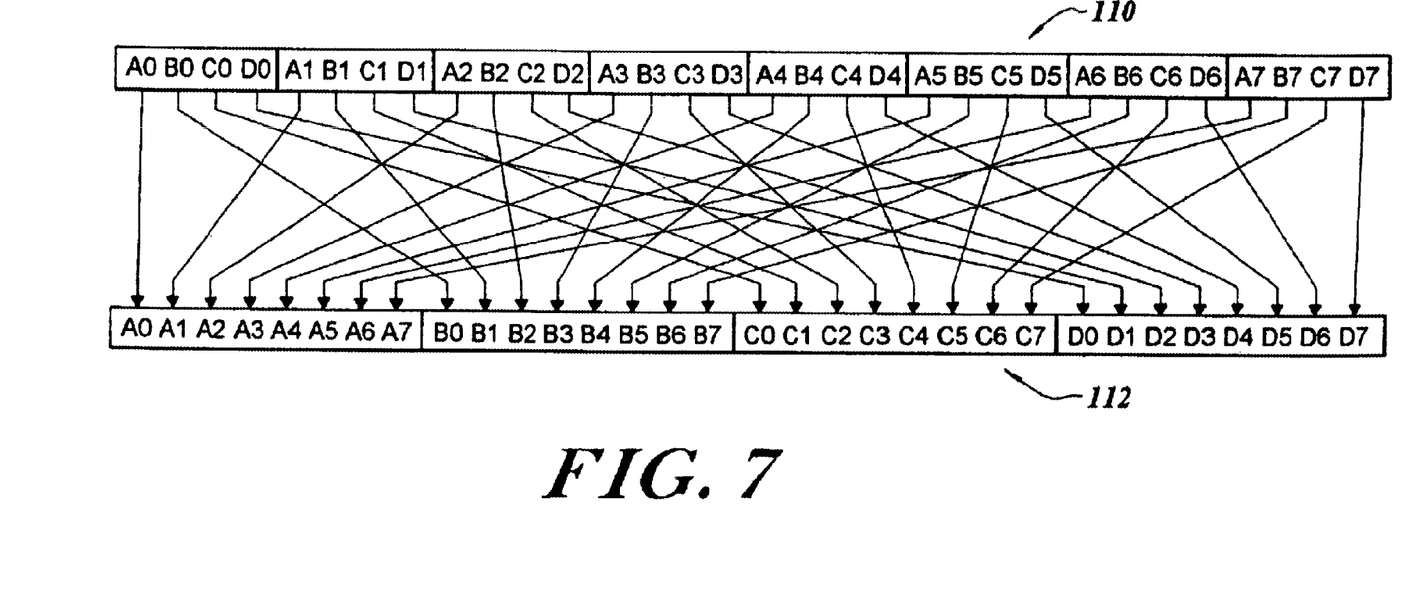
FIG. 7 illustrates bit mapping ("shuffling") between the output mapping circuit and the parallel output interface illustrated in FIG. 3.

FIG. 7 illustrates bit mapping ("shuffling") between the output mapping circuit 92 (FIG. 3) and parallel output interface 109 (FIG. 3) to provide an output formatted for use by processing devices (e.g., DSPs). Specifically, thirty-two bit word 110 represents the contents of the output mapping circuit 92 (FIG. 3), while thirty-two bit word 112 represents the contents of the parallel output interface 109 (FIG. 3). As shown, words 110 and 112 include the same bits, but some of the bit positions have been changed. This change is performed by mapping the interconnects between the output mapping circuit 92 and the parallel output interface 109. For example, referring to FIG. 7, bit $A_1$ is located in the fifth bit position of the word 110 located in the output mapping circuit 92 (FIG. 3). However, the interconnects between the output mapping circuit 92 and the parallel output interface 109 are configured such that the bit $A_1$ is mapped into the second bit position of the word 112 located in the parallel output! interface 109 (FIG. 3). Bit $B_0$ is located in the second bit position of the output mapping circuit 92 and when it is clocked into the parallel output interface 109 it is placed in the ninth bit position due to the interconnect mapping. The remaining mappings are shown in FIG. 7. The parallel output interface preferably includes a thirty-two bit clocked register.

We shall now discuss the parallel-to-serial conversion path of the conversion engine 20 illustrated in FIG. 2.

Figure 8:
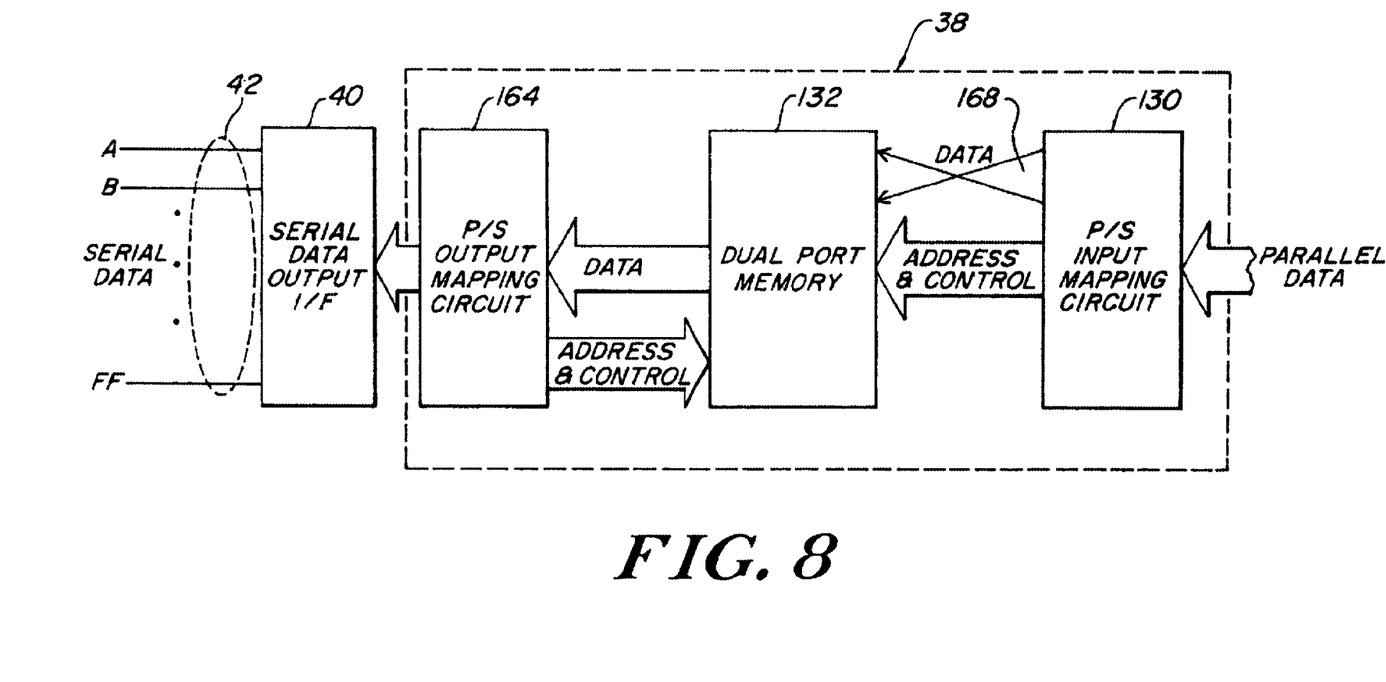
FIG. 8 is a functional illustration to the parallel-to-serial conversion path of the conversion engine illustrated in FIG. 2.

Referring again to FIG. 2, the serial-to-parallel/parallel-to-serial conversion engine 20 also includes a parallel-to-serial conversion path comprising the output bit shuffled memory device 38 and the serial data output interface 40. FIG. 8 is a functional illustration to the parallel-to-serial conversion path. The output bit shuffled memory device 38 includes a parallel-to-serial input mapping circuit 130 that comprises a plurality of clocked registers. For example, in a preferred embodiment the clocked data is thirty-two bits wide and therefore the mapping circuit 130 includes thirty-two registers. The parallel-to-serial mapping circuit 130 also generates command signals (e.g., writes enables) and address signals for writing the data in the circuit 130 into a parallel-to-serial dual port memory 132. An example of a write to the parallel-to-serial dual port memory 132 shall now be presented.

Figure 9:
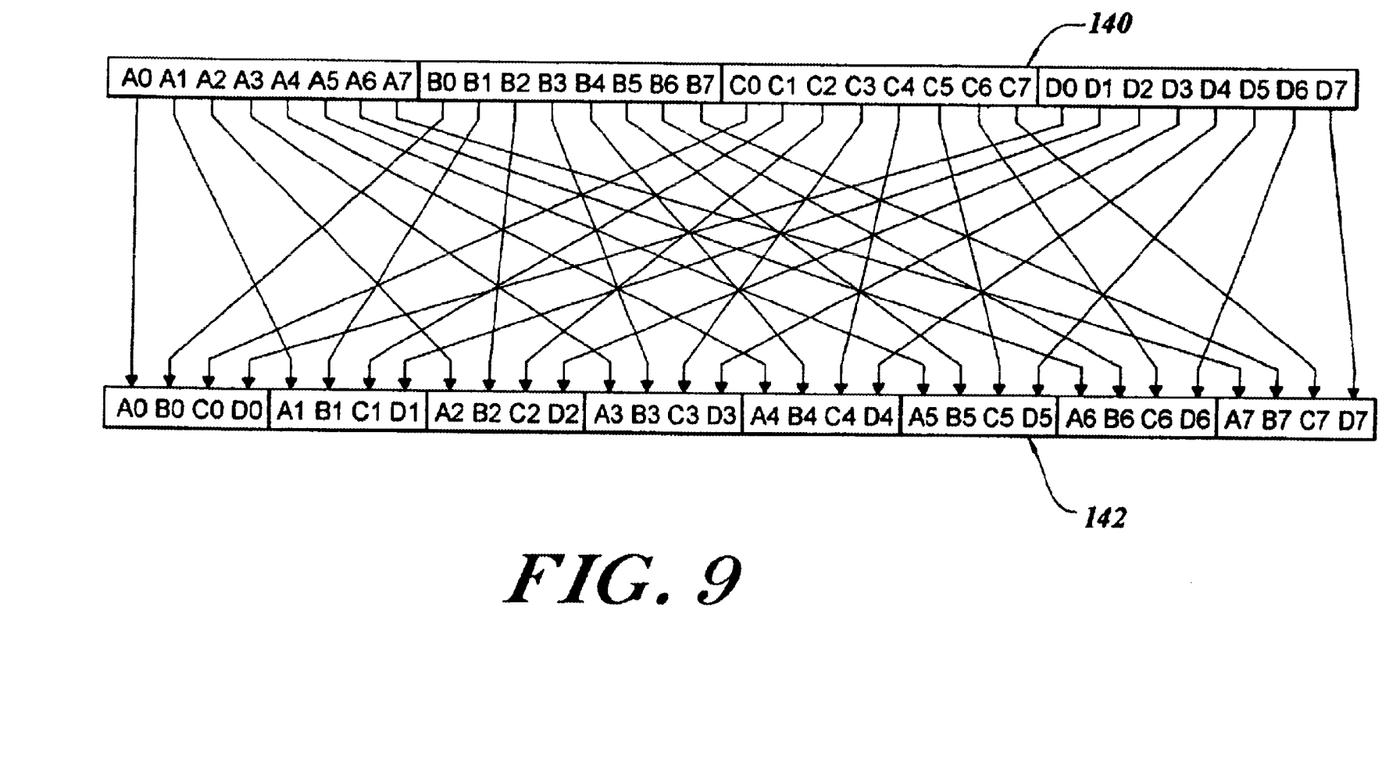
FIG. 9 is a pictorial illustration of the bit mapping between the parallel-to-serial mapping circuit and the dual port memory illustrated in FIG. 8.

FIG. 9 is a pictorial illustration of the bit mapping between the parallel-to-serial mapping circuit 130 (FIG. 8) and the dual port memory 132 (FIG. 8). Specifically, thirty-two bit word 140 represents the data received by the parallel-to-serial input mapping circuit 130 (FIG. 8), while thirty-two bit word 142 represents the data received by the parallel-to-serial dual port memory 132. As shown, the words 140 and 142 include the same bits, but some of the bit positions have been changed. The position changes are performed by mapping of the interconnects between the parallel-to-serial input mapping circuit 130 and the parallel-to-serial dual port memory 132, as shown in FIG. 9. The entire word 142 is written into the parallel-to-serial dual port memory 132.

Figure 10:
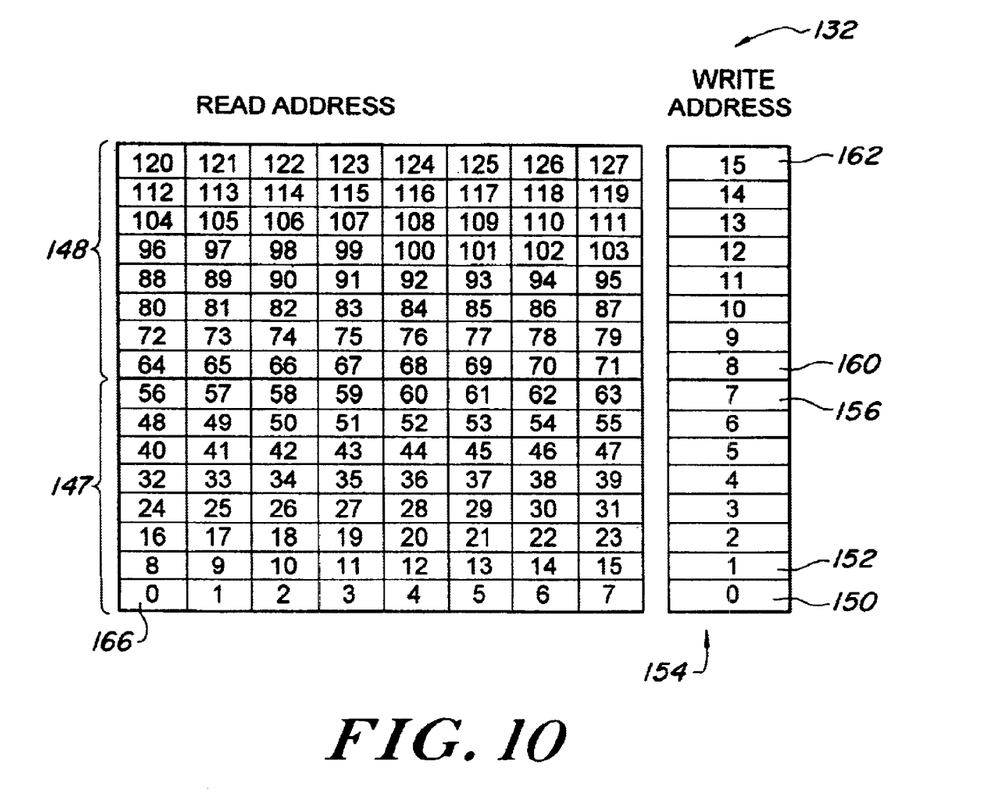
FIG. 10 is a pictorial illustration of labeled memory locations within the parallel-to-serial dual port memory illustrated in FIG. 8.

FIG. 10 is a pictorial illustration of labeled memory locations within the parallel-to-serial dual port memory 132 illustrated in FIG. 8. The memory device 132 also includes two banks 147, 148. Referring now to FIGS. 8–10, the data word 142 is written into write address 0 150 as shown in FIG. 10. During the next write cycle at time t =1, the next data word is written to write location 1 152. Subsequent writes continue up column 154 until the eighth word is written to write address location 7 156. The next write occurs in the second bank 148 of the memory device and occurs at write location 8 160, and writes continue up the column 154. Following the write to memory location 15 162, the next write wraps around to memory location 0 150 and the writes continue up the column 154 again.

Figure 11:
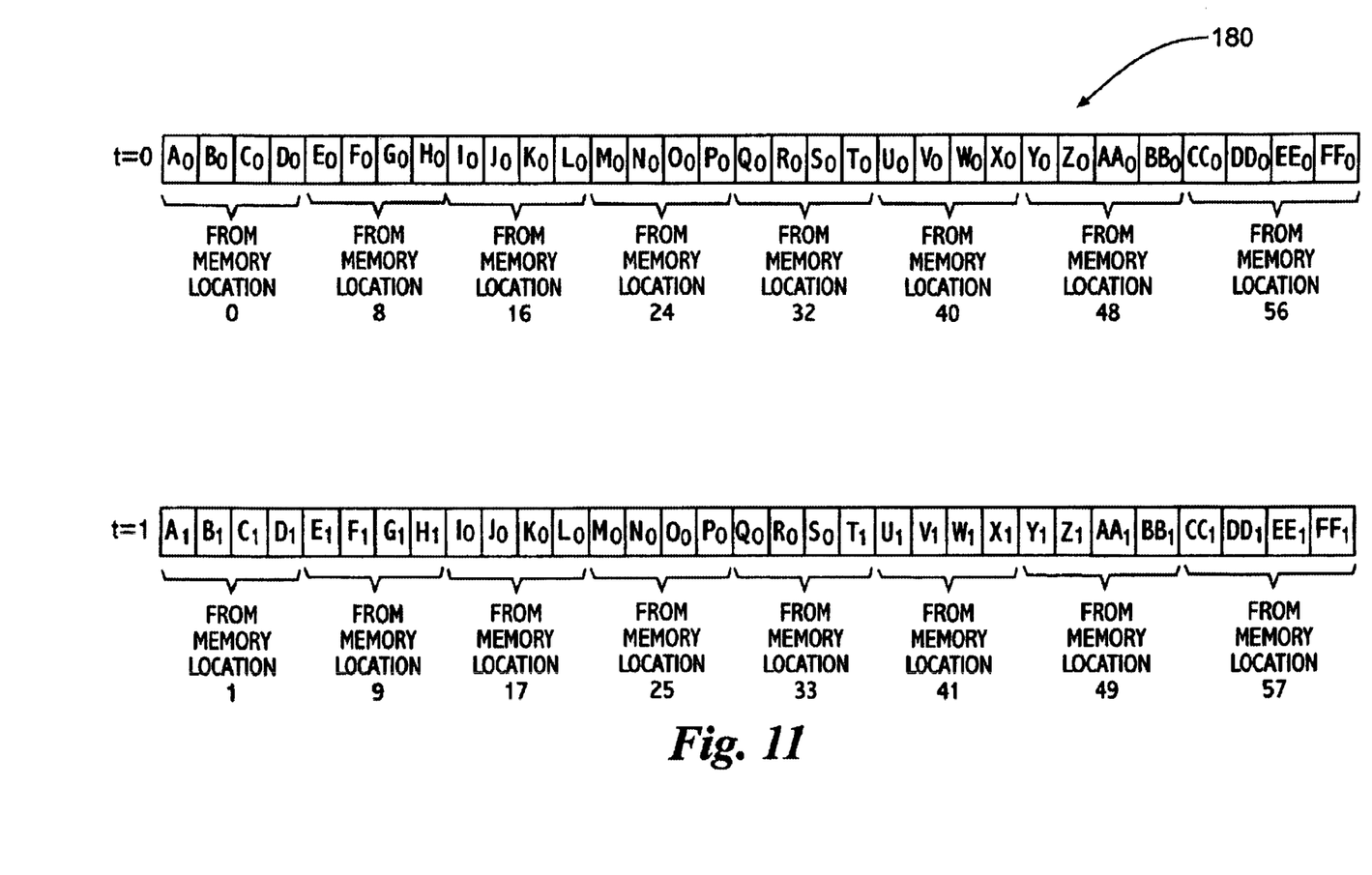
FIG. 11 illustrates a data word 180 resident in the output mapping circuit illustrated in FIG. 8.

Referring again to FIG. 8, the parallel-to-serial conversion path also includes a parallel-to-serial output mapping circuit 164 that reads data from the dual port memory device 132. The parallel-to-serial output mapping circuit 164 generates the address signals and control signals to read data from the memory device 132. At the same time that the input mapping circuit 130 is writing data to the first bank 147 (FIG. 10) of the dual port memory device 132, the output mapping circuit 164 is reading data from second bank 148 (FIG. 10). In one embodiment, the read accesses start at read addresses 0 166 and continues up the column with addresses 8, 16, 24, 32, 40, 48 and 56 (FIG. 10). Each of these read addresses contains four-bits of data. Therefore, each read provides a nibble of data that is placed in the parallel-to-serial output mapping circuit 164. For example, FIG. 11 illustrates a data word 180 resident in the output mapping circuit 164. Notably, this figure illustrates the bit positions of the data read from the dual port memory in the output mapping circuit 164 during time period t=0. Data word 182 represents the positioning of the data read from the dual port memory in the output mapping circuit during time period t=1. The conversion engine switches reads and writes back and forth between the first and second banks of the memory devices.

Although the present invention has been discussed in the context of a H.110 bus compatible system, one of ordinary skill will recognize that the present invention is certainly not so limited. Consider the following:

N=the number of serial streams in the serial TDM highway;
B=the number of bits in each time-slot;
M=the clock multiplication factor;
D=the depth of each of the dual ported memory RAMs;
W=the width of each of the dual-ported RAMs;

For any system N and B must first be determined. In one embodiment, the number of dual port RAMs will be equal to B. The depth of the RAMs is D=2M and the width W=N/M. The clock multiplication factor is usually set equal to the number of streams N. However, at some point the resultant clock frequency will exceed a frequency that can be practically implemented. For example, if an 8.192 Mbit/s clock were used with N=M=32, the required clock rate would be over 285 MHz. For such a system, a better choice is N=16 and M=8 resulting in D=16 and W=2 and thus a clock rate of 65.536 MHz.

The present invention may be used with systems where the bit rates of the serial streams are not equal. However, the ration of the larger frequency to the smaller frequency should be a factor of two. In this case the parallel bus is operated at the higher of the frequencies and the rate at which each bit of the input and output registers is adjusted to the proper rate. In this embodiment the data from any "extra" memory reads is ignored.

It suffices that although the present invention has been discussed in the context of eight bit words and certain clock rates and memory sizes, one of ordinary skill in the art will recognize that the present invention is not so limited. It is contemplated that the present invention shall be employed in system that use different word sizes, and the sizes of the corresponding circuitry will changed accordingly to provide an efficient serial-to-parallel and/or a parallel-to-serial conversion engine. In addition, the present invention is certainly not limited to interfacing with a 32–bit TDM highway. Furthermore, although the present invention presented a preferred embodiment that employs dual port memory devices, it is contemplated that in an alternative embodiment single port memory devices may be combined and the necessary control logic added to perform the function of the dual port memory devices set forth herein.

Referring to FIG. 3, it is also contemplated that a bit shuffling decoder logic (not ;15 shown) may be located between the memory device 46 and the output mapping circuit 92 to perform the bit "shuffling", thus eliminating the mapping (i.e., crisscrossing) of the interconnects between the output mapping circuit and the parallel output interface.

The present invention has been shown and described with respect to several preferred embodiments thereof. However, various changes, omissions and additions to the form and detail thereof, may be made therein, without departing from the spirit and scope of the invention.

What is claimed is:

1. Apparatus for converting a serially received data word to a parallel output data word, said apparatus comprising:

a serial data input interface that receives the serially received data work, and provides a received data word;

a serial-to-parallel mapping circuit that receives said received data word and generates memory write control and write address signals;

a memory device having a first port responsive to said memory write control signals and write address signals for writing said received data word into said memory device, and a second port responsive to memory read control and read address signals for reading data from said memory device;

said serial-to-parallel mapping circuit comprises means for partitioning said received data word into a plurality of partitioned received data words and for generating said memory write control signals such that said partitioned received data words are written into said memory device at uniquely associated memory addresses; and output interface circuitry that generates said memory read control and read address signals, and receives output data from said memory device and reorders the bits of said output data to provide a parallel output data word, wherein said output interface circuitry comprises an output mapping circuit responsive to said output data and a parallel output interface wherein reordering of the bits of said output data word is performed by mapping interconnects between an output port of said output mapping circuit and an input port parallel output interface, wherein said parallel output interface also includes a parallel output interface output port that provided the parallel output data word.

2. The apparatus of claim 1, wherein said output mapping circuit reads a word from said memory device, where said word read from said memory has an equal number of bits as said serially received data word.

3. The apparatus of claim 1, wherein said serial data input interface clocks in said serially received data word at a first rate and said serial-to-parallel mapping circuit clocks data at a second rate having a frequency eight times faster than said first rate.

4. Apparatus for converting a parallel received data word to a serially converted output data word, said apparatus comprising:

a parallel-to-serial input mapping circuit that receives the parallel received data word that includes a plurality of bits, and generates memory write control signals and write address signals, and also reorders said received parallel data word to provide a reordered parallel data word;

a memory device having (i) a first port responsive to said memory write control signals and write address signals for writing said reordered parallel data word into said memory device, and (ii) a second port responsive to memory read control and read address signals for reading data from said memory device;

a parallel-to-serial output mapping circuit that generates said memory read control signals and said read address signals, and receives output data from said memory device and partitions said received output data into a plurality of serial data words; and wherein said parallel-to-serial input mapping circuit reorders the bits of the parallel received data word written to said memory device by mapping interconnects between said parallel-to-serial input mapping circuit and said memory device to provide said reordered parallel data word, and said apparatus also includes a serial data output interface receives said plurality of serial data words and provides said serially converted output data word.

5. The apparatus of claim 4, wherein said memory device is configured as a dual port memory device that includes at least a first bank of memory locations and a second bank of memory locations, wherein while data is being written into memory locations of said first bank under the control of said parallel-to-serial input mapping circuit, data can be read from memory locations of said second bank under the control of said parallel-to-serial output mapping circuit.

6. The apparatus of claim 5 wherein said memory device includes a volatile memory device.

7. The apparatus of claim 5, wherein said memory device includes a non-volatile memory device.

* * * * *